(12) United States Patent
Huang et al.

(10) Patent No.: US 6,275,389 B1
(45) Date of Patent: Aug. 14, 2001

(54) ELECTRONIC DEVICE RETAINER

(75) Inventors: Yao-Chi Huang, Yung-Ho; Jung-Chueh Hsu, Taipei, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/291,258

(22) Filed: Apr. 13, 1999

(30) Foreign Application Priority Data

Aug. 31, 1998 (TW) .................................................. 87214315

(51) Int. Cl.$^7$ ..................................................... H01R 12/00
(52) U.S. Cl. ........................ 361/807; 361/801; 361/809; 439/64; 439/564; 439/573
(58) Field of Search ..................................... 361/740, 741, 361/756, 759, 801, 802, 807, 809; 439/64, 328, 354, 377, 564, 573; 211/41.17

(56) References Cited

U.S. PATENT DOCUMENTS 5,984,689 * 11/1999 Dong ........................................ 439/64
6,099,323 * 8/2000 Ho et al. ................................. 439/64
6,157,536 * 12/2000 Huang et al. ......................... 361/801

\* cited by examiner

*Primary Examiner*—Jayprakash N. Gandhi
*Assistant Examiner*—John B. Vigushin
(74) *Attorney, Agent, or Firm*—Wei Te Chung

(57) ABSTRACT

A retainer adapted to mount an electronic device to a circuit board, includes two spaced arms, each having an elongate body defining a channel for receiving an edge of the device thereby retaining the device between the two arms. Each retaining arm defines two cavities therein respectively proximate opposite ends of the body. Each cavity has a square configuration to snugly receive a square nut therein. The cavity has a bottom periphery to support the nut and a top periphery to retain the nut in the cavity. A through hole is defined in the bottom periphery to receive a bolt that extends from the circuit board and threadingly engages with the nut thereby securing the retaining arm to the circuit board. The top periphery of the cavity defines a circular recess and a cylindrical section of the nut is received and retained in the recess for further securing the nut in the cavity.

14 Claims, 3 Drawing Sheets

ELECTRONIC DEVICE RETAINER

BACKGROUND OF THE INVENTION

1. Field of the Invention

The present invention generally relates to a retainer for mounting an electronic device to a circuit board, and in particular to a retainer structure capable of retaining fasteners for securing the retainer to the circuit board in the retainer when mounting the retainer to the circuit board.

2. The Prior Art

Electronic devices, such as a CPU module, may be mounted to a circuit board by means of a retainer premounted on the circuit board. There are a number of retainers serving this purpose available on the market. Some of the retainers are fixed to the circuit board by means of fasteners, such as a bolt and nut assembly. Conventionally, the bolt and the nut are separate from the retainer before the retainer is mounted to the circuit board. However, the fasteners may be inadvertently dropped into the computer casing during the process of mounting the retainer to the circuit board. Due to the small size of the fasteners, especially the nuts, it may be extremely difficult to recover the fastener immediately thereby delaying and complicating the operations, such as maintenance and assembly, of the computer.

It is thus desirable to have an electronic device retainer having a structure capable to firmly hold the fastener therein so as to overcome the above problem.

SUMMARY OF THE INVENTION

Accordingly, an object of the present invention is to provide an electronic device retainer which is capable of firmly holding a nut therein.

Another object of the present invention is to provide an electronic device retainer having a structure that allows the mounting of the retainer on a circuit board to be carried out easily and efficiently.

To achieve the above objects, a retainer in accordance with the present invention that is adapted to mount an electronic device, such as a central processing unit (CPU) module, to a circuit board comprises two arms, each having an elongate body defining a channel for receiving an edge of the CPU module thereby retaining the CPU module between the two arms. Each retaining arm defines two cavities therein respectively proximate opposite ends of the body. Each cavity has a square configuration to snugly receive a square nut therein. The cavity has a bottom periphery to support the nut and a top periphery to retain the nut in the cavity. A through hole is defined in the bottom periphery to receive a bolt that extends from the circuit board and threadingly engages with the nut thereby securing the retaining arm to the circuit board. The top periphery of the cavity defines a circular recess and a cylindrical section of the nut is received and retained in the recess for further securing the nut in the cavity.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENTS

Figure 2:
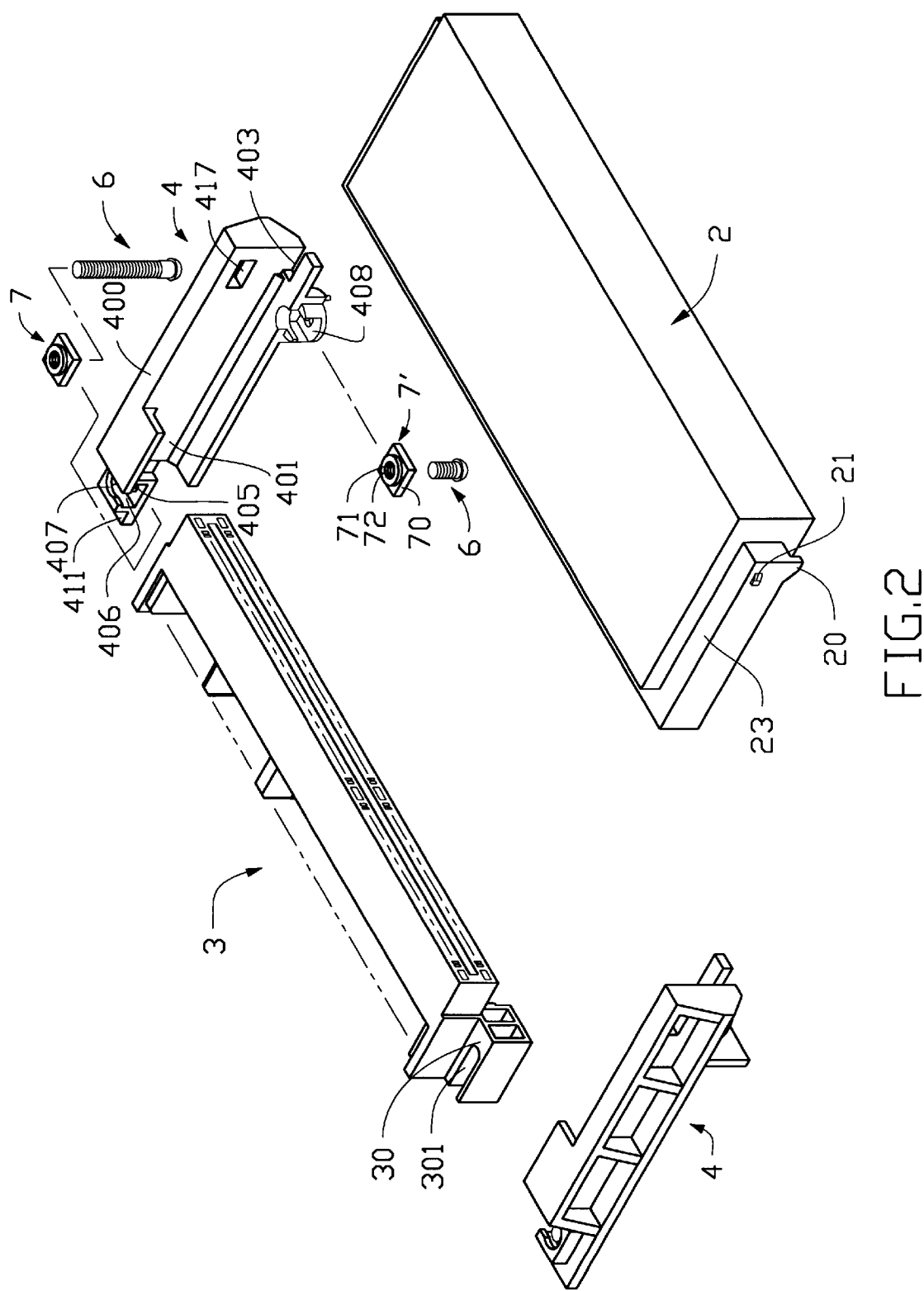
FIG. 2 is an exploded view showing the electronic device retainer retaining an electronic device to an electrical connector.
Figure 3:
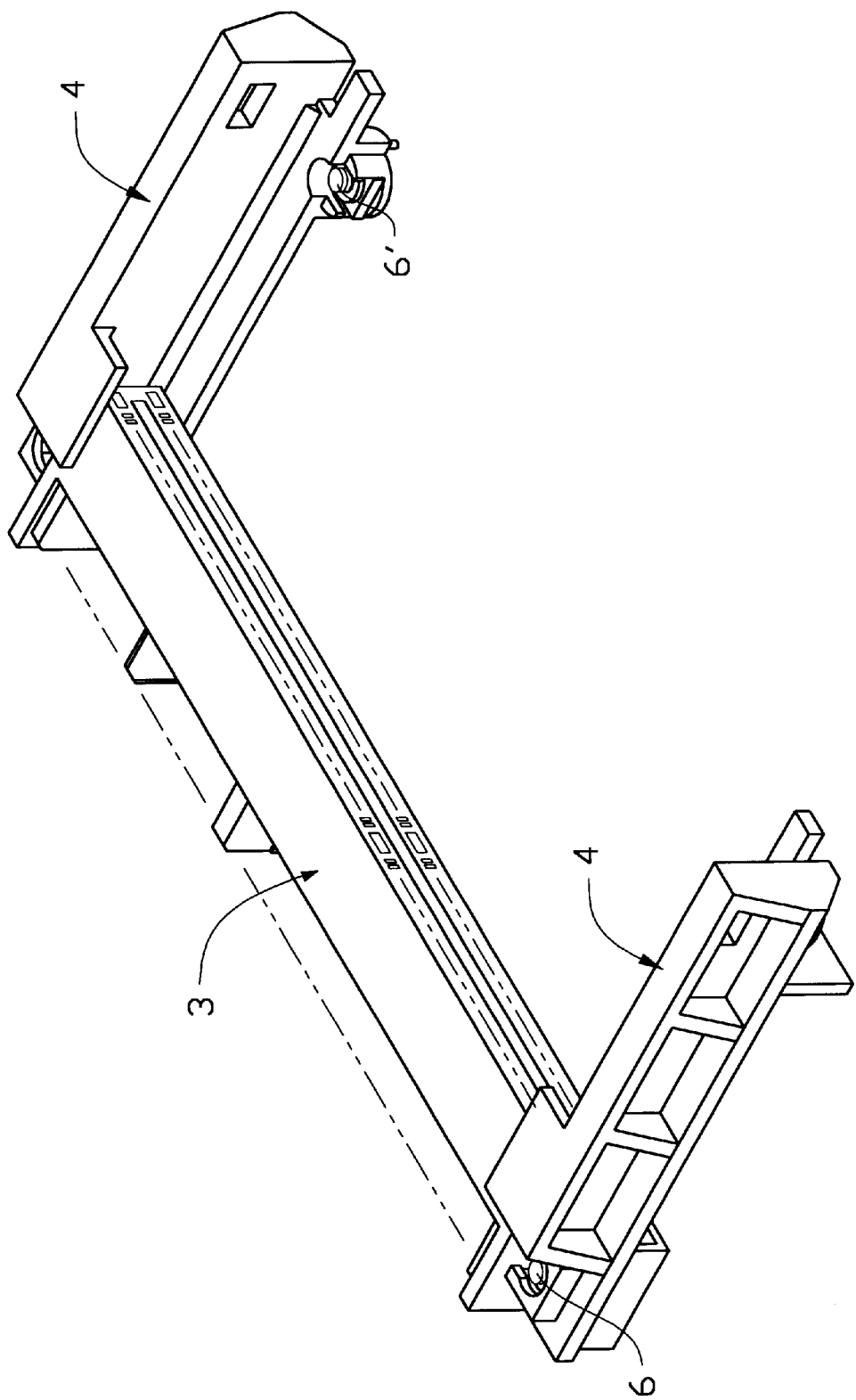
FIG. 3 is a perspective view showing the electronic device retainer mounted to the electrical connector.

Referring to the drawings and in particular to FIG. 3, an electronic device retainer constructed in accordance with the present invention for mounting to an electrical connector 3 comprises a pair of retaining arms 4, each having a base end fixed to the electrical connector 3 by means of a first bolt 6 and nut 7 assembly and a remote end opposite the base end. The retaining arms 4 are spaced from each other to define a space therebetween for accommodating an electronic device 2 (FIG. 2), such as a CPU module.

Figure 1:
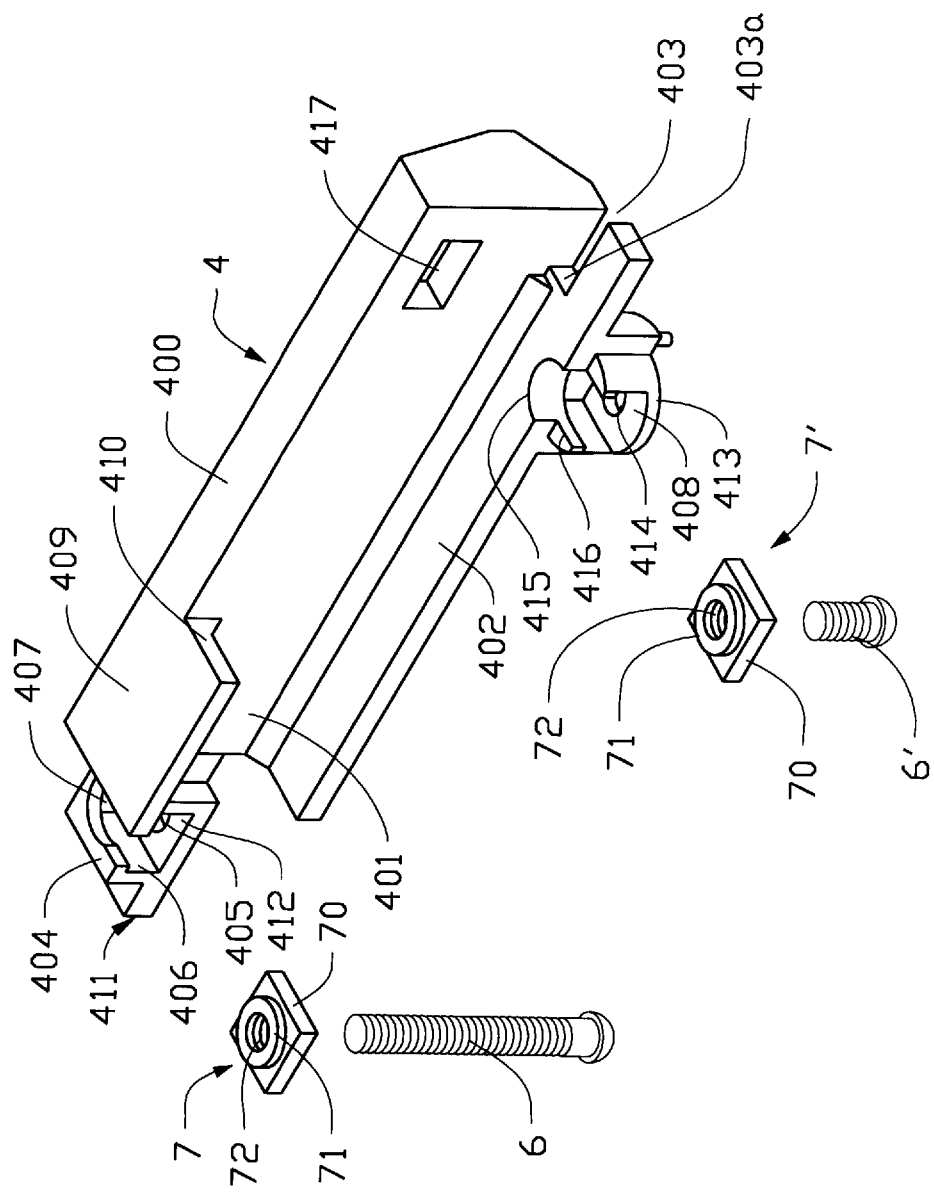
FIG. 1 is a perspective view showing a retaining arm of an electronic device retainer constructed in accordance with the present invention.

Particularly referring to FIGS. 1 and 2, each retaining arm 4 comprises an elongate body having a bottom member 400 and a first and second side walls 402, 409 extending from opposite sides of the bottom member 400 thereby defining a channel 401 therebetween for movably receiving an edge 23 of the electronic device 2. The first side wall 402 is substantially co-extensive with the bottom member 400, while the second side wall 409 is shorter and defines a cutout 410 for facilitating insertion of the edge 23 of the electronic device 2 into the channel 401.

The retaining arm 4 may be provided with engaging means, such as a recess 417 on the bottom member 400 which receivingly engages a barb 21 provided on the edge 23 of the electronic device 2. Furthermore, stop means may also be provided on the retaining arm 4 to retain the electronic device 2 at a fully inserted position and to prevent the electronic device 2 from further insertion into the retainer. The stop means comprises a slot 403 defined in the first side wall 402 and having an open end for receiving a lug 20 provided on the edge 23 of the electronic device 2. The slot 403 has an inner end wall 403a which engages the lug 20 and thus limits the movement of the electronic device 2 along the channel 401.

The retaining arm 4 has a first extension 411 formed on the base end of the retaining arm 4. A first cavity 406 is defined in the first extension 411 to snugly receive and retain a nut 7 therein. Preferably, the first cavity 406 has a square configuration and the nut 7 comprises a square section 70 to be retained in the first cavity 406.

The first cavity 406 has a bottom periphery 412 to support the nut 7. A through hole 405 is defined in the bottom periphery 412 of the first cavity 406 through which a bolt 6 extends to engage with an inner threaded hole 72 of the nut 7.

The first cavity 406 also has a top periphery 404 to securely retain the nut 7 in the first cavity 406. Preferably a circular recess 407 is defined in the top periphery 404 and the nut 7 has a corresponding cylindrical section 71 received in the recess 407.

The retainer of the present invention is adapted to be mounted to a circuit board (not shown) and secured thereon by means of the bolt 6 which extends through a hole (not shown) defined in the circuit board.

The first extension 411 may be arranged to have the bottom periphery 412 of the first cavity 406 spaced from the circuit board whereby a side extension 30 of the electrical connector 3 is interposed between the first extension 411 of the retaining arm 4 and the circuit board. The side extension 30 of the connector 3 defines an opening 301 therein through which the bolt 6 also extends thereby securing both the retaining arm 4 of the retainer of the present invention and the connector 3 to the circuit board (FIG. 3).

If desired, a second bolt 6' and nut 7' assembly having a similar structure may be used to secure the remote end of the retaining arm 4 to the circuit board. The first side wall 402 of the retaining arm 4 is provided with a second cavity 408 similar to the first cavity 406 and having a square configuration for snugly receiving and retaining the square section 70 of the nut 7' therein. The second cavity 408 has a bottom periphery 413 in which a through hole 414 is defined to receive the bolt 6' which engages the inner threaded hole 72 of the nut 7'. A top periphery 416 of the second cavity 408 is provided to securely retain the nut 7' in the second cavity 408. The top periphery 416 defines a hole 415 for receiving the cylindrical section 71 of the nut 7' therein.

The bolt 6' also extends through a hole (not shown) defined in the circuit board thereby securing the remote end of the retaining arm 4 of the retainer to the circuit board.

Although the present invention has been described with reference to a preferred embodiment thereof, it is apparent to those skilled in the art that a variety of modifications and changes may be made without departing from the scope of the present invention which is intended to be defined by the appended claims.

What is claimed is:

1. A retainer adapted to be mounted to a base for retaining an electronic device to the base, comprising a pair of retaining arms mounted to the base and spaced from each other to receive the electronic device therebetween, each of the retaining arms comprising:

an elongate body having a bottom member and two side walls extending from opposite sides of the bottom member to define a channel for receiving an edge of the electronic device therein, the electronic device being movable with respect to the channel from a first end of the body to a second end; and holding means for securing the retaining arm to the base, comprising a first cavity defined in the second end of the body of the retaining arm, the first cavity being sized and shaped to snugly receive and retain a first nut therein, the first cavity having a first bottom periphery to support the first nut and an opposite first top periphery to retain the first nut in the first cavity, a through hole being defined in the first bottom periphery through which a first bolt extends to engage the first nut thereby securing the retaining arm to the base.

2. The retainer as claimed in claim 1, wherein the first cavity has a polygonal configuration and the first nut has a polygonal section corresponding to and received in the first cavity.

3. The retainer as claimed in claim 2, wherein the first cavity has a square configuration and wherein the first nut has a square section snugly received in the first cavity.

4. The retainer as claimed in claim 2, wherein the retaining arm comprises stop means for limiting the movement of the electronic device with respect to the channel.

5. The retainer as claimed in claim 4, wherein the stop means comprises a slot defined in one of the side walls having an opening end for receiving a lug provided on the electronic device, the slot having an inner end wall engageable by the lug to limit the movement of the electronic device.

6. The retainer as claimed in claim 1, wherein the first top periphery of the first cavity defines an opening and wherein the first nut comprises a cylindrical section received in the opening of the first top periphery.

7. The retainer as claimed in claim 1, wherein the holding means further comprises a second cavity defined in the first end of the elongate body of the retaining arm, the second cavity being dimensioned to snugly receive and retain a second nut therein and having a second bottom periphery for supporting the second nut and an opposite top wall to hold the second nut in the cavity, a through hole being defined in the second bottom periphery through which a second bolt extends to engage the second nut thereby securing the retaining arm to the base.

8. The retainer as claimed in claim 7, wherein the second cavity has a polygonal configuration and wherein the second nut has a polygonal section corresponding to and received in the second cavity.

9. The retainer as claimed in claim 8, wherein the second cavity has a square configuration and wherein the second nut has a square section snugly received in the second cavity.

10. The retainer as claimed in claim 8, wherein the top wall of the second cavity defines an opening and wherein the second nut comprises a cylindrical section received in the opening of the top wall.

11. The retainer as claimed in claim 1, wherein the retaining arm comprises engaging means for engaging and securing the electronic device therein.

12. The retainer as claimed in claim 11, wherein the engaging means comprises a recess defined in the bottom member of the retaining arm for engaging with a barb provided on the electronic device.

13. The retainer as claimed in claim 1, wherein the second end of the retaining arm is adapted to be fixed to a connector thereby allowing the electronic device received in the retainer to be connected to the connector.

14. The retainer as claimed in claim 13, wherein the second end of the retaining arm comprises an extension in which the first cavity is defined, the extension being spaced from the base to receive a portion of the connector therebetween, the portion of the connector defining an opening through which the first bolt also extends thereby securing the second end of the retaining arm to the connector.

* * * * *